United States Patent
Zhu et al.

(10) Patent No.: US 7,983,074 B2
(45) Date of Patent: Jul. 19, 2011

(54) FERROMAGNETIC NANORINGS, MEDIUMS EMBODYING SAME INCLUDING DEVICES AND METHODS RELATED THERETO

(75) Inventors: Frank Qing Zhu, San Jose, CA (US); Chia-Ling Chien, Cockeysville, MD (US)

(73) Assignee: The Johns Hopkins University, Baltimore, MD (US)

( * ) Notice: Subject to any disclaimer, the term of this patent is extended or adjusted under 35 U.S.C. 154(b) by 501 days.

(21) Appl. No.: 11/885,846

(22) PCT Filed: Mar. 14, 2006

(86) PCT No.: PCT/US2006/009312
§ 371 (c)(1),
(2), (4) Date: Dec. 8, 2008

(87) PCT Pub. No.: WO2006/099482
PCT Pub. Date: Sep. 21, 2006

(65) Prior Publication Data
US 2009/0146767 A1 Jun. 11, 2009

Related U.S. Application Data

(60) Provisional application No. 60/661,569, filed on Mar. 14, 2005.

(51) Int. Cl.
*G11C 11/00* (2006.01)
(52) U.S. Cl. .......................................... 365/158; 365/60
(58) Field of Classification Search .................... 365/60, 365/158
See application file for complete search history.

(56) References Cited

U.S. PATENT DOCUMENTS

| | | |
|---|---|---|
| 6,906,369 B2 | 6/2005 | Ross et al. |
| 7,002,839 B2 | 2/2006 | Kawabata et al. |
| 7,099,185 B2 | 8/2006 | Yamamoto et al. |
| 7,187,578 B2 | 3/2007 | Hong et al. |
| 2004/0213039 A1* | 10/2004 | Kawabata et al. ............ 365/158 |

OTHER PUBLICATIONS

Hehn, et al., "Nanoscale Magnetic Domains in Mesoscopic Magnets", *Science*, 1996, 272, 1782.
Kirk, et al., "Switching of Nanoscale Magnetic Elements", *Appl. Phys. Lett.*, 1999, 75, 3683.
Herrmann, et al., "Investigation of the Influence of Edge Structure on the Micromagnetis Behavior or Small Magnetic Elements", *J. Appl. Phys.* 2000, 87, 2994.
C.A. Ross, "Patterned Magnetic Recording Media", *Annu. Rev. Mater. Res.*, 2001, 31, 203.
Zhu, et al., "Ultrahigh-Density Arrays of Ferromagnetic Nanorings on Macroscopic Areas", *Advanced Materials*, 2004, 16, 2155.

(Continued)

*Primary Examiner* — Hoai V Ho
(74) *Attorney, Agent, or Firm* — Edwards Angell Palmer & Dodge LLP; Peter F. Corless; William J. Daley, Jr.

(57) ABSTRACT

Featured is a magnetic ring structure including at least a vortex magnetic state such as symmetrically and asymmetrically shaped nanorings (FIG. 7C), having small diameters (e.g., on the order of 100 run). In particular embodiments, the width and thickness of the maxima and minima thereof are located on opposite sides of the nanoring. Also featured are methods for fabricating such symmetrically and asymmetrically shaped nanorings (FIG. 1). Also featured are methods for controlling the reversal process so as to thereby create vortex states in such asymmetric nanorings by controlling the field angle (FIG. 9).

15 Claims, 6 Drawing Sheets

OTHER PUBLICATIONS

Zhu, et al., "Ultrahigh Density Vertical Magnetoresistive Random Access Memory (Invited)", *J. Appl. Phys.*, 2000, 87, 6668.

Hanarp, et al., "Control of Nanoparticle Film Structure for Colloidal Lithography", *Colloids and Surfaces*, A, 2003, 214, 23.

\* cited by examiner

Monolayer of PS spheres on substrate precoated with trilayer of polymers.

Deposition of Co layer by magnetron sputtering.

(a) If ion beam etches at a normal angle, symmetric rings form under the nanospheres. (b) When substrate is tilted by an angle α, the ion beam incident angle is also α, and asymmetric rings form.

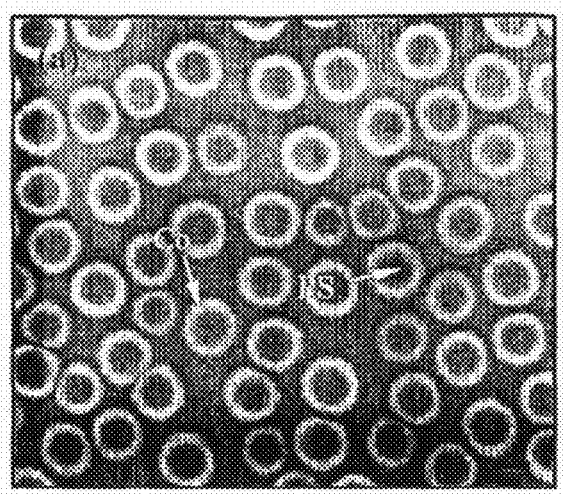 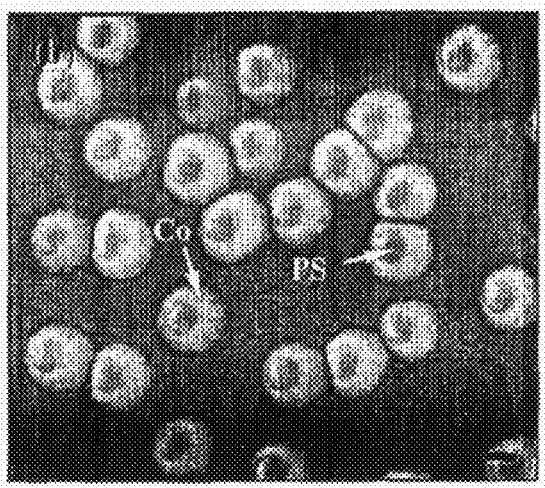
Fig. 5A                                          Fig. 5B
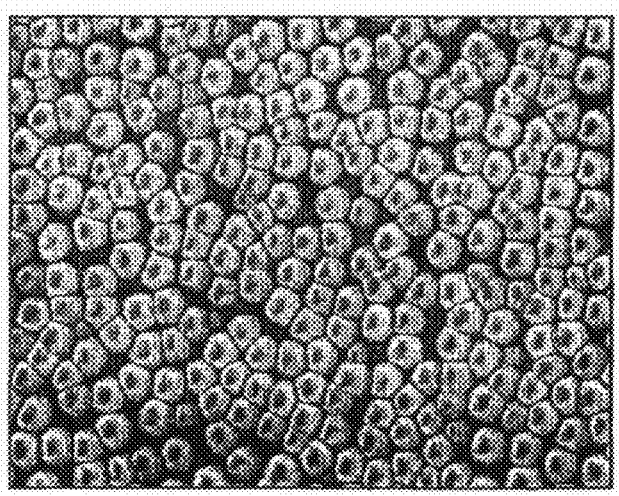
Fig. 6

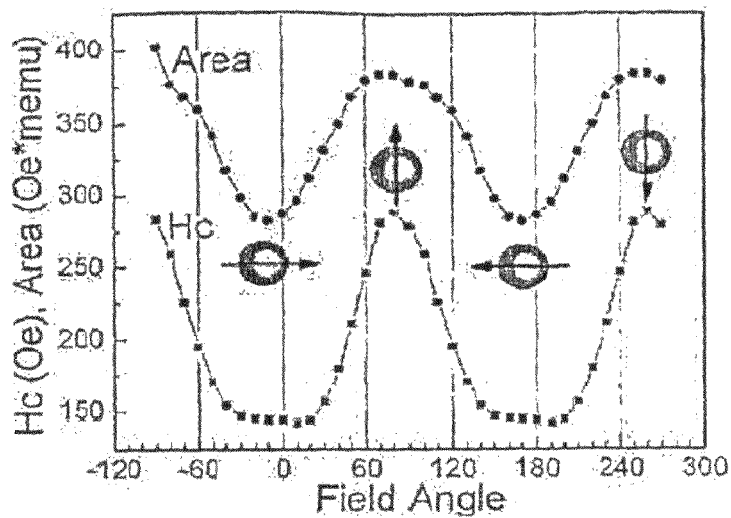
Fig. 9
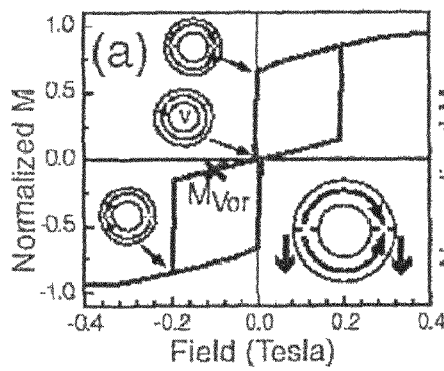 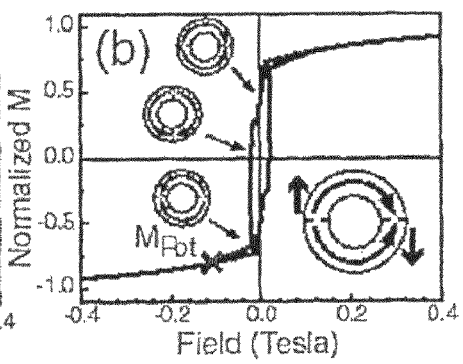
Fig. 10A	Fig. 10B
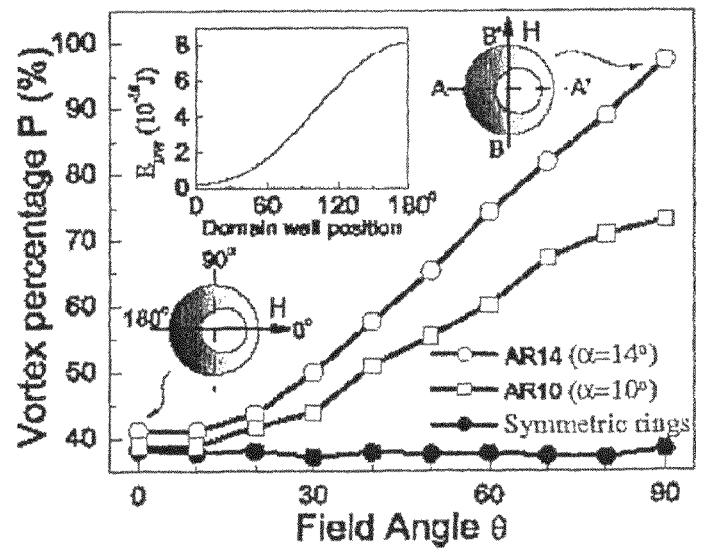
Fig. 11

FERROMAGNETIC NANORINGS, MEDIUMS EMBODYING SAME INCLUDING DEVICES AND METHODS RELATED THERETO

This application claims the benefit of U.S. Provisional Application Ser. No. 60/661,569 filed Mar. 14, 2005, the teaching of which are incorporated herein by reference.

STATEMENT REGARDING FEDERALLY-SPONSORED RESEARCH

The present invention was supported by grants from the National Science Foundation, grant number DMR00-80031. The U.S. Government may have certain rights to the present invention.

FIELD OF INVENTION

The present invention relates to magnetic memory and more particularly to ring-shaped memory elements, more specifically to asymmetric ring-shaped memory elements and yet more specifically to asymmetric ring-shaped memory elements having a vortex magnetic state.

BACKGROUND OF THE INVENTION

There are a number of different types of devices and methods for storage of data or information that do not lose the data or information thereon. Such storage devices or mediums are sometimes referred to as non-volatile types of memory or storage devices and include magnetic storage mediums (e.g. magnetic disc or hard drives, magnetic tape drives, flash memory cards, EEPROMS) and magneto-optical storage mediums (e.g., CD, CDROM, CDRAM, DVD, DVD±R or DVD±RW). Conventional random access memory (e.g., SRAM, DRAM) on the other hand loses any data or information contained in the memory when power is lost to the device that uses the memory. Thus, conventional computers and processing systems typical include different types of memory systems that use different types of memory so as to meet operational needs or requirements (e.g., RAM for use with the CPU and a non-volatile memory-magnetic hard drive for long term data storage).

Notwithstanding the efficacy of conventional long term magnetic storage devices, new types of patterned media for information storage have been explored to replace the continuous magnetic films used in current magnetic storage in order to achieve higher storage density. M. Hehn, K. Ounadjela, J. P. Bucher, F. Rousseaux, D. Decanini, B. Bartenlian, C.; Chappert, *Science* 1996, 272, 1782.; K Y J. Kirk, J. N. Chapman, S. McVitie, P. R. Aitchison, C. D. W. Wilkinson, *Appl. Phys. Lett.* 1999, 75, 3683; M. Herrmann, S. McVitie, J. N. Chapman, *J. Appl. Phys.* 2000, 87, 2994; C. A. Ross, *Annu. Rev. Mater. Res.* 2001, 31, 203. In patterned media, a bit, either "0" or "1", is stored in a single magnetic entity, rather than in a bit consisting of a number of grains as in continuous film. Such new types of patterned media for information storage include magnetic dots and magnetic disks. Both small dots and discs with sizes less tan about 200 nm, however, have been found to have poor magnetic stability especially when the separations between the small entities are small.

Nanoscale magnetic entities play a prominent role in many devices in which the shape and dimension of the entities dictate their intricate magnetization configurations and switching characteristics. M. Hehn, K. Ounadjela, J. P. Bucher, F. Rousseaux, D. Decanini, B. Bartenlian, C. Chappert, *Science* 1996, 272, 1782; K Y J. Kirk, J. N. Chapman, S. McVitie, P. R. Aitchison, C. D. W. Wilkinson, *Appl. Phys. Lett.* 1999, 75, 3683; M. Herrmann, S. McVitie, J. N. Chapman, *J. Appl. Phys.* 2000, 87, 2994; A. Ross, *Annu. Rev. Mater. Res.* 2001, 31, 203. Of particular interest are small circular disks that can acquire the so-called vortex state, in which the magnetic flux is confined within the magnetic entity and creates no stray fields, so that the cross-talk between entities can be reduced. However, the vortex core (with magnetization pointing out of the plane of the disk) tends to destabilize the vortex state, which consequently is replaced by the single-domain state in sufficiently small disks. In supermalloy disks, the transition from vortex state to single-domain state occurs at a diameter of a few hundred nanometers. However, the instability of the vortex core in a small circular disk can be circumvented by removing the central region of the disk to form a ring structure, the so-called "nanorings". Nanorings possess highly stable vortex states in which the magnetic moments form circular loops along the circumference. The chirality of the vortex states, clockwise and counterclockwise, can be utilized to store information of "0" and "1". For nanorings with 100 nm to 500 nm in diameter, there are two processes for switching their magnetizations: vortex formation process and onion rotation process.

Experimental results for micron-diameter rings and 300-800 nm diameter octagonal ring structures show the existence of just two different magnetic states: one being the flux-closure or vortex state and the other a bi-domain state with two 180 degree domain walls, called an onion state. There also has been reported in US2004/0211996 another metastable state called a twisted state for smaller diameter rings. This twisted state contains a 360 degree domain wall and can exist over a wide range of applied fields. To attain such a twisted state, the nanoring is configured so as to include a deviation (e.g., notch), artifact so that the domain wall is pinned at the locations of the deviations. A nanoring having such a deviation or configuration was referred to as being asymmetric. These nanorings also were fabricated by a liftoff process from ring-shaped patterns written into a resist layer by electron-beam lithography.

In such structures, each ring can store a bit of information depending on its magnetic state. The rings are written by applying magnetic fields (the fields are produced bypassing currents through adjacent conductive lines). The data-bit in the rings is read back by detecting the rings' electrical resistance, which depends on their magnetic states. The dependence of resistance on magnetic state is called magnetoresistance. To use magnetoresistance for data readback it is most convenient to make the memory element out of a magnetic multilayer, for instance two magnetic layers separated by a non-magnetic spacer. In such a multilayer (called a spin-valve or tunnel junction), the resistance can vary by up to about 10-50% depending on the relative magnetization directions of the two magnetic layers and the structure of the multilayer.

In sum, small magnetic nanorings can not only maintain stable vortex states, but also hold the potential for information storage in the two chiralities of the circulating magnetization. These properties of nanorings have also led to the proposal of high-density, vertical, magnetic, random access memory (VMRAM consisting of multilayered nanorings with exceptional stability and desirable switching characteristics. J. G. Zhu, Y. Zheng, G. A. Prinz, *J. Appl. Phys.* 2000, 87, 6668.

For these reasons, the study of magnetic nanorings of various sizes has been actively pursued recently. Electron-beam lithography (FBL) is one method used for fabricating magnetic nanorings. Most of the magnetic rings previously reported have been in the micrometer-size range, with few reports existing on sub-micrometer-sized nanorings. The arrays of magnetic rings made by EBL usually have a small number of rings (e.g., less than $10^3$) with low areal densities (e.g., 0.5 rings $\mu m^2$ or less). As such, the magnetic signal of the magnetic nanorings has been too weak for full characterization using magnetometry. Instead, the magnetic characteristics have been measured or inferred by surface magneto-optic Kerr effect (MOKE) measurements, resistance measurements, Hall-sensor measurements, and magnetic force microscopy. In these cases, the external applied magnetic field could only be applied in certain directions, and not all, so as not to interfere with the specific measuring technique used. Also, magnetic nanorings fabricated by e-beam lithography are limited to a small area with low areal density.

The present inventors have discovered from magnetic measurements of symmetrically shaped nanorings, that when the diameters of symmetrically shaped magnetic nanorings are of the order of 100 nm, the magnetic reversal undergoes two processes with similar probabilities. One is the vortex reversal process, in which the vortex states can be sustained. The other one is the rotating onion process that involves no vortex states.

It thus would be desirable to provide a ferromagnetic nanoring including an assemblage of such nanorings having small diameters and methods for making such ferromagnetic nanorings. It would be particularly desirable to provide such methods for fabricating such ferromagnetic nanorings having controlled dimensions including diameter, width, and thickness as well as areal density. It also would be desirable to provide such methods for fabricating nanorings that yield nanorings that are symmetrically or asymmetrically shaped. It also would be desirable to provide methods for controlling application of the magnetic field to the nanoring(s), in particular the asymmetrically shaped nanorings so as to thereby control the formation of a vortex state in such nanorings.

SUMMARY OF THE INVENTION

The present invention features symmetrically and asymmetrically shaped nanorings, having small diameters (e.g., on the order of 100 nm) as well as methods for fabricating such symmetrically and asymmetrically shaped nanorings. Also featured are methods for creating vortex states in such asymmetric nanorings by controlling the field angle.

According to one aspect of the present invention, there is provided a method for fabricating a magnetic-ring structure having one of a symmetric or asymmetric shape on a substrate. The term asymmetric as used in the subject application shall be understood to mean a ring structure whose width and thickness is controlled but which does not create a condition by which a domain wall is pinned at a given location. In particular embodiments, such methods are lithographic-less that is not directly formed using electron beam lithography techniques.

More specifically, such methods include forming or creating a template such as an array of nanospheres on the surface of a substrate and applying a magnetic material to such a surface. To form symmetrically shaped nanorings, the magnetic material is etched by applying the etching beam at an angle that is generally normal to the surface of the substrate so that the magnetic material remaining is that which is generally disposed beneath the nanosphere. To form asymmetrically shaped nanorings, the substrate is tilted so as to be at an angle (an oblique angle) with respect to the general direction of the etching beam. In particular embodiments, the substrate is tilted at an angle between 0 and 90 degrees. As each nanosphere thus blocks the etching beam to different degrees, the ring of magnetic material formed along one part of the circumference will be generally characterized as having a larger width or cross-section than another part of the circumference. Following the formation of such nanorings, the method can include applying a protective material and/or removing each nanosphere.

According to another aspect of the present invention, there is featured a method for recording information in such nanorings. More particularly, such methods include controlling the angle of the field with respect to an asymmetric axis of the nanoring so as to be within a predetermined range of angles so as to thereby control the formation of a vortex state as compared to an onion state in the nanorings. More specifically the field angle is controlled with respect to the asymmetric axis so the percentage of vortex states in the asymmetric rings is in the range of from 41% to 97%.

The symmetrically shaped and asymmetrically shaped nanorings of the present invention have a diameter (inner diameter) of about 50 nm and larger.

The asymmetric nanorings of the present invention are configured or shaped so that the width of the asymmetric nanoring varies as a function of radius or the locations on the circumference of the nanoring. In more particular embodiments, the width of the asymmetric nanoring varies continuously about the circumference of the nanoring. In more particular embodiments, the width of the asymmetric nanoring varies so that the minimum width and the maximum width are spaced from each and so as to be on opposite sides of the nanoring, more specifically they are spaced about 180 deg from each other. In yet more particular embodiments, the maximum width of a nanoring is in the range of between 2 and 5 times larger than the minimum width of the nanoring.

The asymmetric nanorings of the present invention also are configured or shaped so that the thickness of the asymmetric nanoring varies as a function of radius. In more particular embodiments, the thickness of the asymmetric nanoring varies continuously about the circumference of the nanoring. In more particular embodiments, the thickness of the asymmetric nanoring varies so that the minimum thickness and the maximum thickness are spaced from each and so as to be on opposite sides of the nanoring, more specifically they are spaced about 180 deg from each other. In yet more particular embodiments, the maximum thickness of a nanoring is in the range of between 2 and 5 times larger than the minimum thickness of the nanoring.

Other aspects and embodiments of the invention are discussed below.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein:

FIGS. 5A,B are micrograph illustrations of top views of the substrate surface with the nanorings using scanning electron microscopy (SEM) that shows the structure of symmetrically shaped nanorings (FIG. 5A) and asymmetrically shaped nanorings (FIG. 5B);

FIG. 6 is a top view SEM micrograph illustrating areal density of asymmetric rings having a nominal 100 nm diameter;

FIG. 9 is a graphical view of field angle dependence of coercively and loop area;

FIGS. 10 A,B are graphical views of the vortex reversal process (FIG. 10A) and the rotating onion process (FIG. 10B); and FIG. 11 is a graphical view illustrating the relationship between vortex percentage and field angle.

DESCRIPTION OF THE PREFERRED EMBODIMENT

Figure 1:
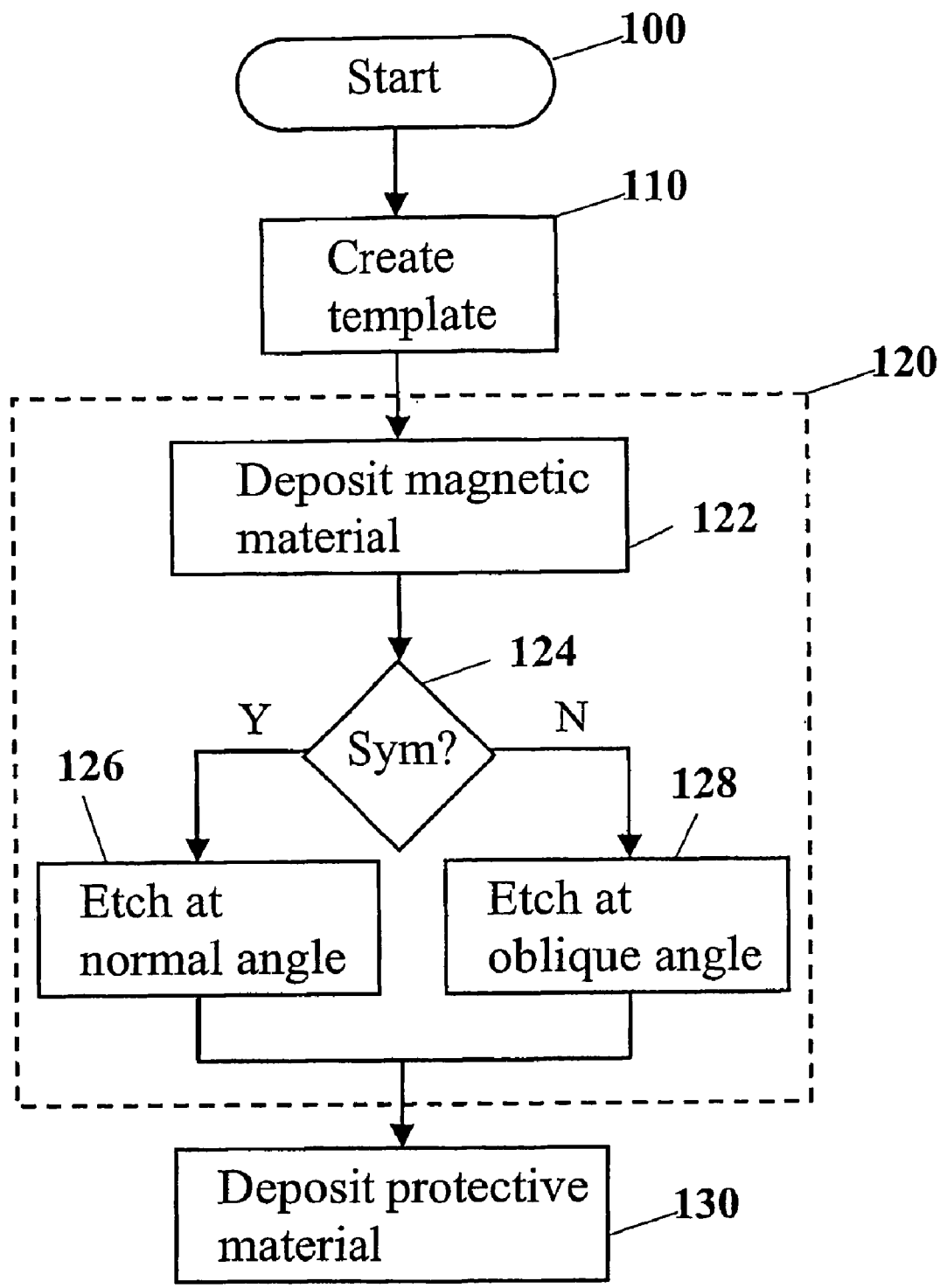
FIG. 1 is a high-level flow-diagram of the process for fabricating a symmetric or asymmetric nanoring according to the present invention.
Figure 2:
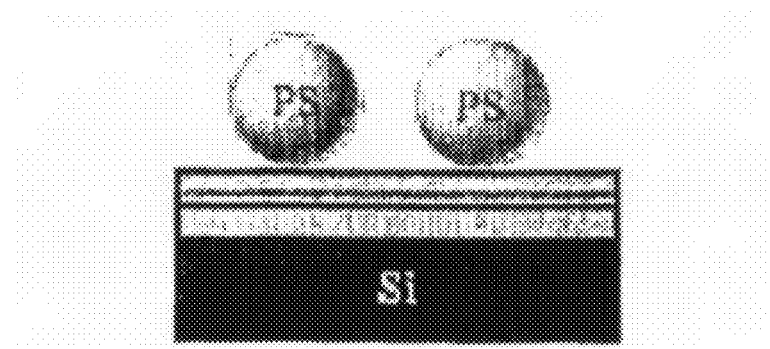
FIG. 2 is an illustration depicting the formation of a monolayer of nanospheres on the substrate.
Figure 3:
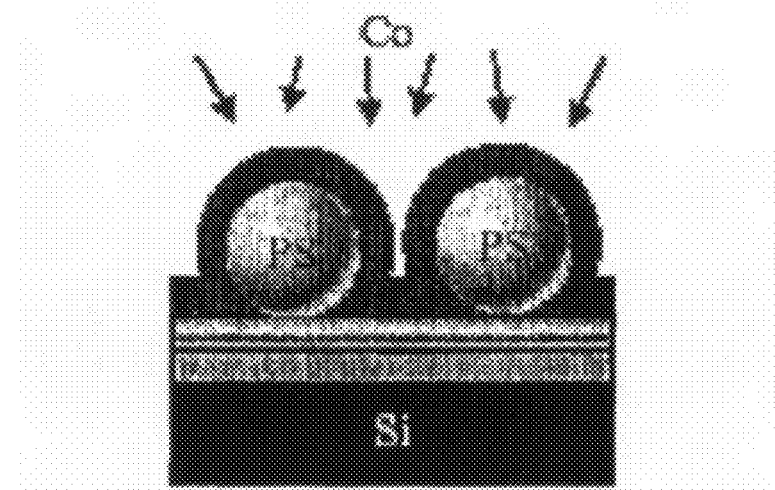
FIG. 3 is an illustration depicting the formation of a layer of magnetic material on the substrate surface having the nanospheres.

Referring now to the various figures of the drawing wherein like reference characters refer to like parts, there is shown in FIG. 1 a high level flow diagram of the process for fabricating or forming nanorings that are symmetrically shaped or asymmetrically shaped. The process is started, Step 100, by obtaining and arranging the materials so as to carry out the below described process. For example, a silicon wafer is pre-coated with a 20 nm layer of sputtered titanium and oxidized in air (e.g. 300° C., 15 minutes) for use as a substrate in the below described process.

After starting the process, a template, such as a template of nanospheres, is formed on a surface of the substrate, Step 110. In particular embodiments, a conventional layer by layer coating method [P. Hanarp, D. S. Sutherland, J. Gold, B. Jasemo, *Colloids and Surfaces A* 2003, 214, 23] is used to make the substrate surface positively charged. The three layers in sequence are: (1) poly(diallyldimethylammonium chloride) (PDDA), (2) poly(sodium 3styrenesulfonate) (PSS), and (3) aluminum chloride hydroxide (ACH). The substrate is immersed in each solution for 30 seconds, rinsed by deionized (DI) water and then dried by blowing $N_2$. Thus, the substrate includes these three layers plus the titanium layer.

The substrates are then immersed in a 0.125~0.5wt-% polystyrene (PS) sphere suspension for 5 minutes, finally rinsed by de-ionized water and dried by blowing $N_2$. The negatively charged polystyrene spheres are attached to the positively charge substrates due to electrostatic attraction. This process thereby creates a monolayer of polystyrene nanospheres on the surface of the substrate.

After creating the template, the nanorings are created using the nanospheres, Step 120. More particularly, the substrates having the nanospheres are mounted to a substrate or sample holder that is disposed within a sputtering system such as a magnetron sputtering system. In yet more particular embodiments, the substrate or sample holder is configured so as to be tiltable as hereinafter described.

The sputtering system is thereafter operated so that a layer of magnetic material as is known to those skilled in the art is applied to the surface of the substrate on which is disposed the nanospheres, Step 122. The magnetic material is any of a number of materials known to those skilled in the art that are appropriate for the intended use and particular manufacturing method. In exemplary embodiments, a cobalt (Co) film is sputter-deposited from a 99.995% pure Co target in a magnetron sputtering system with $6 \times 10^{-8}$ Torr base pressure and 6 mtorr Argon (Ar)-sputtering pressure. The sample or substrate holder(s) is/are moved so the substrate is swept across the sputtering plasma in order to have uniform thicknesses everywhere. The sputtering rate of Co at 50 mA sputtering current is 1.78 Å/sec. As is known in the art, the film thickness is controlled by the sputtering time.

Following the deposition of a layer of magnetic material (Step 122), the magnetic material layer is etched or processed using techniques known to those skilled in the art to selectively remove certain of the magnetic material (e.g., the magnetic material other than that underneath the nanospheres) and depending upon whether the process is to yield symmetrically shaped or asymmetrically shaped nanorings, Step 124.

Figure 4A:
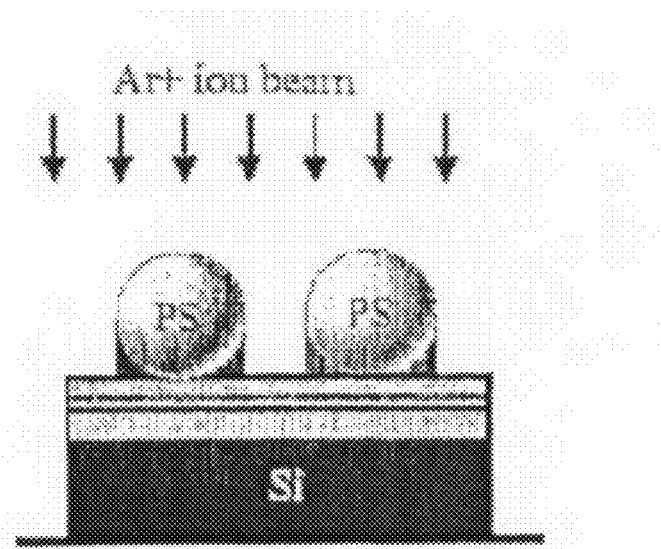
FIG. 4A is an illustration depicting ion beam etching to form symmetrically shaped nanorings.

In an exemplary illustrative embodiments, a broad beam Argon ($Ar^+$) ion source is used to etch the samples. As indicated above, the ion beam etches off all the magnetic/cobalt (Co) material except the Co material underneath the PS spheres. To obtain symmetrically shaped nanorings, the ion beam is arranged so that the ion beam is generally normal to the substrate surface, Step 126. When so arranged the ion beam etches the surface at a normal angle and symmetrically shaped rings are formed under the nanospheres as illustrated in FIG. 4A.

Figure 4B:
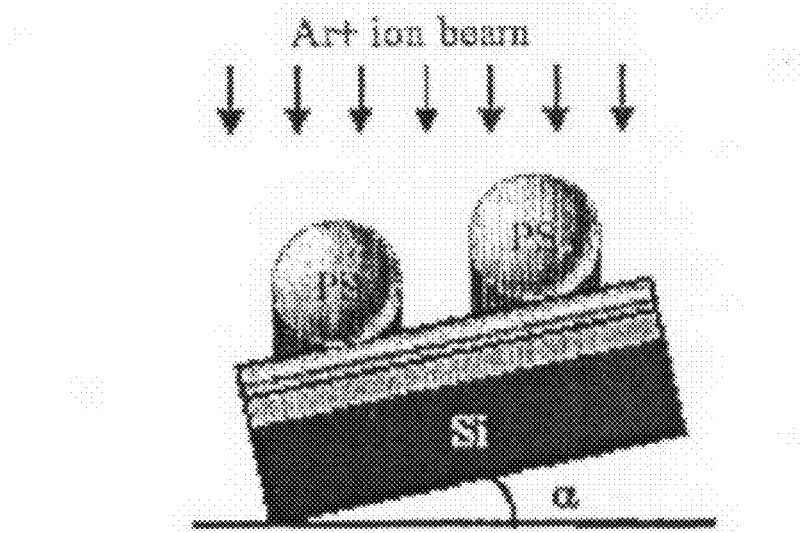
FIG. 4B is an illustration depicting ion beam etching to form asymmetrically shaped nanorings.

If asymmetrically shaped nanorings are to be produced, the sample/substrate holder is tilted so that the substrate is tilted by an angle a and so the ion beam incident angle with respect to the substrate surface also will be α, Step 128. In this way, asymmetric nanorings are formed under the spheres as illustrated in FIG. 4B. In illustrative embodiments, a Veeco 3 cm DC $Ar^+$ ion source is used to perform the etching, where the working conditions are: 500 V beam voltage, 66 mA beam current, 1000 V acceleration voltage and 0.23 mtorr Ar pressure. The etching rate of cobalt under these conditions is 10.54 Å/sec. In further embodiments, the substrate tilting angle a is adjusted from 0° to 20° continuously inside the chamber without breaking the vacuum. It should be noted that the SEM images and magnetic measurements of asymmetric nanorings discussed below, unless otherwise indicated, are for a substrate that was etched at a 14° incident angle.

After such etching, forming the nanorings (Step 120), a protective material is deposited upon the etched surface to prevent oxidation of the magnetic nanorings, Step 130. Such a protective layer is of a material that does not affect the magnetic properties of the nanorings. In illustrative embodiments, the whole surface is coated with 3 nm protective layer of gold (Au) or copper (Cu), which protection layer is deposited by magnetron sputtering. In addition, following such etching it is within the scope of the present invention to remove the polystyrene nanospheres such as by chemically etching or chemically decomposing.

Symmetrically shaped and asymmetrically shaped nanorings were formed using the above techniques. The following reports the structure and characterizes the properties of such nanorings.

A scanning electron microscope (SEM) was used to study the structure of the nanorings formed using the above described techniques, where FIGS. 5A and 5B are the top view micrographs of symmetric and asymmetric cobalt (Co) nanorings, respectively. In the micrographs, the bright areas show the Co rings and the central areas are the exposed PS spheres.

From the micrographs, the areal density of symmetric nanorings in FIG. 5A was determined to be about 45 rings/um², or 30 Giga-rings/in². The areal density of the asymmetric nanorings shown in FIG. 5B appears low, however, this is due to the low concentration of polystyrene nanospheres in the solution in the preparation step.

In contrast to FIG. 5B, there is shown in FIG. 6 a micrograph that shows that asymmetric nanorings can be formed on the substrate with a higher areal density. Although the nanorings are close to each other in FIG. 6, they remain separated from each other. The average density of nanorings in this micrograph is about 35 rings/μm², or 23 Giga-rings/in².

Figures 7A, 7B:
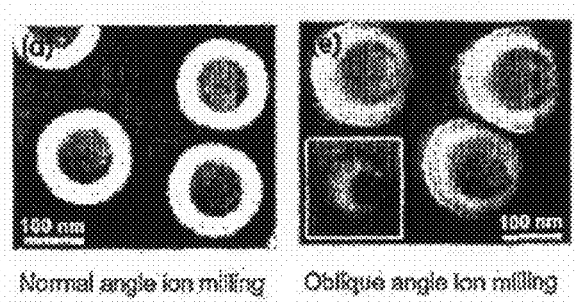
FIGS. 7A,B are a close-up views of a micrographs of symmetric nanorings (FIG. 7A) and of asymmetric nanorings (FIG. 7B) having a 100 nm nominal diameter.
Figure 7C:
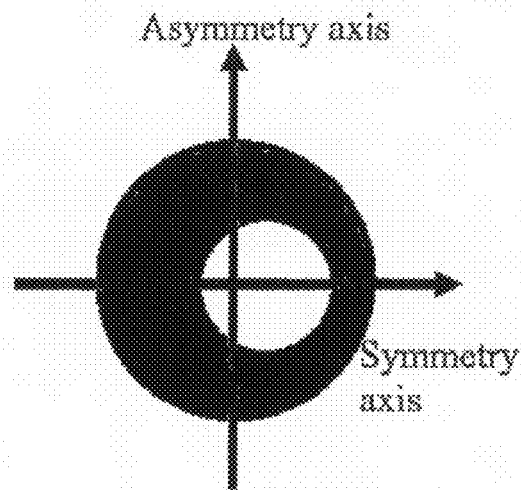
FIG. 7C is a top view of an asymmetric nanoring to define the symmetry and asymmetry axes of an asymmetric nanoring.

There is shown in FIGS. 7A,B a high magnification top view SEM image of the symmetric nanorings (FIG. 7A) and a high magnification top view SEM image of the asymmetric nanorings (FIG. 7B). From the image for the asymmetric nanorings, one can determine that the inner diameter is 100 nm, the width of the left wall of the nanoring is 50 nm and the width of the right wall is 10 nm. The symmetry and asymmetry axes of an asymmetric nanoring are shown in FIG. 7C.

Figures 8A, 8B:
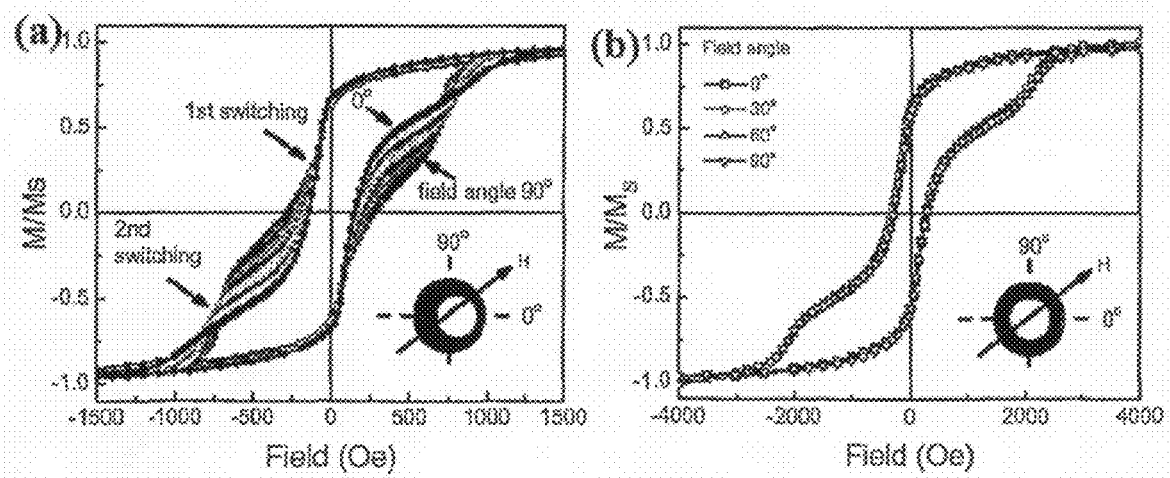
FIGS. 8A,B are graphical views of hysteresis loops for asymmetric nanorings etched at an 14 deg. incident angle and a symmetric nanorings etched at a normal angle.

Referring now to FIGS. 8A, B there are shown graphical views of the measured hysteresis loops of asymmetric and normal nanorings, respectively. The hysteresis loops were measured by a vibrating sample magnetometer (VSM) with the magnetic field along various directions.

More specifically, in FIG. 8A, ten hysteresis loops with H applied at different directions of the asymmetrical nanorings are plotted together. They share some similarities but with important differences. The similar characteristics are: (1) two switching fields: the first switching happens at a small field between 140 and 280 Oe, the second switching at a much larger field about 750 Oe; (2) squareness (defined as the ratio of remanence to saturation magnetization) is always 65%; (3) slow changes of magnetization when the field value H is between the two switching fields. However, these loops also have important differences. When the field angle changes from 0° to 90°, the magnetization values between the two switching fields as well as the second value of switching field systematically decrease. In contrast, the hysteresis loops of the symmetric rings measured at various angles are essentially the same, as revealed in FIG. 8B.

The strong dependence of switching characteristics on the field angle of the asymmetrical nanoring is better illustrated in FIG. 9, where the values of coercivity and the hysteresis loop area are plotted versus the field angle. Both parameters are periodic functions of field angle with a period of 180°, and have maxima (minima) when fields are along the asymmetry (symmetry) axis.

To understand why the field angle can affect the switching behaviors of asymmetric nanorings but not the symmetric ones, one first needs to know the switching processes of symmetric nanorings. As indicated in F. Q. Zhu, D. L. Fan, X. C. Zhu, J. G. Zhu, R. C. Camarata, C. L. Chien, *Advanced Materials* 2004, 16, 2155, such studies show that the magnetic reversal of a symmetric magnetic ring can undergo two processes. One is the vortex reversal process, during which the vortex states can be sustained when field value is between the two switching fields. The characteristic of its hysteresis loops is the very small magnetizations between the two switching fields, as shown in FIG. 10A. The other process is the rotating onion process that involves no vortex states and has only one switching field. In this case, the magnetization value reaches 65% of the saturation value when magnetic field is beyond the coercivity and then gradually increases to saturation value with the magnetic field. The two processes can occur simultaneously in the same sample with different probabilities. The overall hysteresis loop is therefore the weighted superposition of these two processes.

The actual percentage of the vortex reversal process can be calculated by numerically fitting the experimental data with the two simulated loops in FIGS. 10A,B. For uniform nanorings of 100 nm in diameter, as shown in FIG. 8B, the vortex reversal process has a probability of 40% (this percentage does not depend on the field angle). For asymmetric nanorings etched at 14° incident angle, the hysteresis loops depend strongly on the field angle. The calculated percentage (P) of vortex reversal process is plotted as a function of the field angle θ in FIG. 11. The calculated percentage (P) depends on the field angle θ almost linearly when θ is larger than 30° with a slope of about 0.8%/degree. In other words, every 1° increase of the field angle will increase the vortex process by about 0.8%. When the field is along the symmetry axis, P is 41%, however, when field is along the asymmetry axis, P is 97%. Thus, any value of P above 41% can be obtained by setting the magnetic field along an appropriate angle.

According to further aspects of the present invention, the ring width and thickness for asymmetric nanorings vary along the circumference, with their minima and maxima separated by about 180° (i.e., the minima and maxima are located on opposite sides or portions of the nanoring). The domain wall energy E(θ), therefore, changes with the angular position θ of the domain wall as plotted in the inset of FIG. 11. If the initial magnetic field is along the symmetry axis, one domain wall (DMW1) will be generated at the thinnest location A and the other domain wall (DMW2) at the thickest location A' after the field is removed (FIG. 8A). Under a reversal magnetic field, DMW1 and DMW2 still have two possible directions to move, and the situation is not very different from that of the symmetric rings. The vortex probability P is close to that of a uniform nanoring. If the initial field is along the asymmetry axis, however, DMW1 and DMW2 will be generated at the middle locations B and B' with the largest slope. Both domain walls tend to slide to the same energy minimum position A'. As a consequence, the vortex formation process is enhanced. The higher the asymmetry and the larger the geometrical slope, the higher P is, as shown in FIG. 11.

Others have imposed some form of additional anisotropy into the rings and disks to break the circular symmetry; these include creating two notches at the opposite ends in the rings as local domain wall pinning centers and fabricating elliptical rings. These schemes, however, introduce anisotropy only in one axis. Furthermore, the large sizes (micrometers) of the rings also deprive the observation of the onion rotation process. In contrast, for the asymmetrical nanorings of the present invention, the much smaller size (on order of 100 nm) of the nanorings allows the observation of the onion rotation process. More importantly, the asymmetric nanorings of the present invention create a non-local and continuously varying anisotropy by changing the nanoring cross section along the circumference. As a consequence and as described herein, the fractions of the vortex and the rotating-onion processes can be controlled by the direction of the applied magnetic field.

As described herein, for the patterned media of the present invention, each magnetic entity or nanoring can be used to store a bit "0" or "1". Further such nanorings, in particular asymmetrically shaped ferromagnetic nanorings can be utilized in magnetic storage devices in which each nanoring represents one bit. In addition, such asymmetrically shaped ferromagnetic nanorings can be used in vertical magnetic random access memories (VMRAM, in which each bit is a stack of circular rings such as that described in J. G. Zhu, Y. Zheng, G. A. Prinz, *J. Appl. Phys.* 2000, 87, 6668.

Although a preferred embodiment of the invention has been described using specific terms, such description is for illustrative purposes only, and it is to be understood that changes and variations may be made without departing from the spirit or scope of the following claims.

Incorporation by Reference

All patents, published patent applications and other references disclosed herein are hereby expressly incorporated by reference in their entireties by reference.

Equivalents

Those skilled in the art will recognize, or be able to ascertain using no more than routine experimentation, many equivalents of the specific embodiments of the invention described herein. Such equivalents are intended to be encompassed by the following claims.

What is claimed is:

1. A magnetic ring structure comprising at least a vortex magnetic state, wherein the ring structure is configured so that i) the maximum thickness of the ring structure is in the range of between two (2) and five (5) times larger than the minimum thickness, or ii) the width and thickness of the ring structure are asymmetric.

2. The magnetic ring structure of claim 1, wherein the ring structure is established so that the one of the width and thickness varies as a function of radius.

3. The magnetic ring structure of claim 1, wherein the ring structure is established so that a maxima and a minima of the one of the width and thickness are spaced from each other and disposed on opposite sides of the ring structure.

4. The magnetic ring structure of claim 1, wherein the ring structure is established so that a maxima and a minima of the one of the width and thickness are spaced from each other by about 180 deg.

5. The magnetic ring structure of claim 1, wherein the diameter of the ring structure is 50nm or larger.

6. The magnetic ring structure of claim 1, wherein the maximum width of the ring structure is in the range of between two (2) and five (5) times larger than the minimum width.

7. The magnetic ring structure of claim 1, wherein the maximum thickness of the ring structure is in the range of between two (2) and five (5) times larger than the minimum thickness.

8. The magnetic ring structure of claim 1, wherein both of the width and thickness are asymmetric.

9. A method for operating a magnetic nanoring structure comprising the steps of:
    providing an asymmetric nanoring;
    providing said asymmetric ring with the vortex state;
        wherein said providing includes controlling the angle of the field with respect to an asymmetric axis of the asymmetric nanoring; and
        wherein the magnetic nanoring structure is configured so that i) the maximum thickness of the ring structure is in the range of between two (2) and five (5) times larger than the minimum thickness, or ii) the width and thickness of the ring structure are asymmetric.

10. The method of claim 9, wherein the angle of the field is adjusted to maximize the number of nanorings capable of being provided in the vortex state.

11. The method of claim 9, wherein the field is at an angle of between 0 and 90 degrees with respect to the asymmetric axis.

12. The method of claim 9, wherein the provided nanoring is configured such that one of width and thickness thereof is asymmetric.

13. The method of claim 9, wherein the provided nanoring is established so that one of a width and thickness thereof varies as a function of radius of the nanoring.

14. The method of claim 9, wherein the provided nanoring is established so that a maxima and a minima of one of the width and thickness thereof are spaced from each other and disposed on opposite sides of the nanoring.

15. The method of claim 9, wherein the provided nanoring is established so that a maxima and a minima of one of the width and thickness thereof are spaced from each other by about 180 deg.

* * * * *